United States Patent [19]
Prentice et al.

[11] Patent Number: 6,007,631
[45] Date of Patent: Dec. 28, 1999

[54] MULTIPLE HEAD DISPENSING SYSTEM AND METHOD

[75] Inventors: Thomas C. Prentice, Westford, Mass.;
Brian P. Prescott, Fremont, N.H.;
Thomas Purcell, Haverhill, Mass.;
Stephen S. Helm, Winham, N.H.;
Donald J. Martin, Lawrence, Mass.;
Kevin Brown, Sandown, N.H.; James P. Donnelly, Leominster, Mass.

[73] Assignee: Speedline Technologies, Inc., Haverhill, Mass.

[21] Appl. No.: 09/033,022

[22] Filed: Mar. 2, 1998

Related U.S. Application Data

[60] Provisional application No. 60/065,061, Nov. 10, 1997.

[51] Int. Cl.$^6$ ..................................................... B05C 11/00
[52] U.S. Cl. ............................. 118/669; 118/668; 118/695
[58] Field of Search .................................. 118/663, 668, 118/669, 672, 695, 313, 314, 315, 323, 324

[56] References Cited

U.S. PATENT DOCUMENTS

| | | | |
|---|---|---|---|
| 4,176,455 | 12/1979 | Copeland et al. | 33/1 |
| 4,835,710 | 5/1989 | Schnelle et al. | 364/513 |
| 4,838,515 | 6/1989 | Prentice | 248/661 |
| 4,979,093 | 12/1990 | Laine et al. | 364/167.01 |
| 5,092,021 | 3/1992 | Buzzi | 29/38 |
| 5,097,577 | 3/1992 | Buzzi | 29/38 |
| 5,213,559 | 5/1993 | Lunazzi | 483/14 |
| 5,378,282 | 1/1995 | Pollard | 118/697 |
| 5,486,151 | 1/1996 | Bergmann et al. | 483/1 |
| 5,795,390 | 8/1998 | Cavallaro | 118/314 |
| 5,807,044 | 9/1998 | Watari et al. | 409/183 |
| 5,886,494 | 3/1999 | Prentice et al. | 318/625 |
| 5,903,125 | 5/1999 | Prentice et al. | 318/625 |

FOREIGN PATENT DOCUMENTS

| | | |
|---|---|---|
| 0 278 457 | 8/1988 | European Pat. Off. . |
| 0 508 130 | 10/1992 | European Pat. Off. . |
| 0 700 733 | 3/1996 | European Pat. Off. . |
| 2 621 715 | 4/1989 | France . |
| 2 398 937 | 2/1997 | France . |
| 42 34 675 | 4/1993 | Germany . |
| 667 631 A5 | 10/1988 | Switzerland . |
| 2 292 598 | 2/1996 | United Kingdom . |

OTHER PUBLICATIONS

Ing, et al. "The Hexapod Principle" Laboratory for Machine Tools and Production Engineering at Aachen University of Technology.
Hexel Corporation brochure "Hexel's Hexapod Solutions".
Cooke, Arthur, et al. Advanced reconfigurable machine for flexible fabrication. 1995 North AmericanConference on Smart Structures and Materials, San Diego, CA, Feb. 26–Mar. 3, 1996.
Patent Abstracts of Japan vol. 97, No. 3, Mar. 31, 1997 & JP 08 298394 A (Tescon KK), Nov. 12, 1996.
Patent Abstracts of Japan, vol. 17, No. 434 (E–1412), Aug. 11, 1993 & JP 05 090799 A (TDK Corp), Apr. 9, 1993.
International Search Report dated Apr. 19, 1999.

*Primary Examiner*—James Sells
*Attorney, Agent, or Firm*—Mintz, Levin, Cohn, Ferris, Glovsky and Popeo, P.C.

[57] ABSTRACT

Embodiments of the present invention provide a multiple head dispensing system having independently controlled dispensing heads. Each of the dispensing heads may be independently controlled to provide simultaneous, asynchronous operation and to allow dispensing of different materials onto substrates. Independent control of the dispensing heads is accomplished under the control of a controller in conjunction with a plurality of gantry systems, each of which positions one of the multiple dispensing heads over a substrate that is to receive dispensing material. In some embodiments, each gantry system utilizes two drive mechanisms, arranged in parallel, that provide movement of the dispensing head over an x-y plane. Multiple conveyor systems are utilized that allow parallel processing of work products in the dispensing system.

9 Claims, 6 Drawing Sheets

MULTIPLE HEAD DISPENSING SYSTEM AND METHOD

RELATED APPLICATIONS

This application claims priority from Provisional Application Ser. No. 60/065,061, filed Nov. 10, 1997, which is incorporated herein by reference.

FIELD OF THE INVENTION

The present invention relates generally to an apparatus and method for performing a plurality of work operations in parallel using a plurality of work devices within one workstation. More specifically, the present invention relates to an apparatus and method for controlling a dispensing system that dispenses material onto a substrate using a plurality of dispensing heads within a dispensing system.

BACKGROUND OF THE INVENTION

There are several types of prior art dispensing systems used for dispensing metered amounts of liquid or paste for a variety of applications. One such application is in the assembly of printed circuit boards and integrated circuit chips. In this application, dispensing systems are used in the process of encapsulating integrated circuits with an encapsulating material and in the process of underfilling flip integrated circuit chips with an encapsulent. Prior art dispensing systems are also used for dispensing dots or balls of liquid epoxy or solder onto circuit boards and integrated circuits. The liquid epoxy and solder is used to connect components to a circuit board or to an integrated circuit. The dispensing systems described above include those manufactured and distributed by Camelot Systems, Inc., the assignee of the present invention, under the name CAM/ALOT®.

The dispensing systems described above are typically used in an electronics manufacturing facility in an automated assembly line with other equipment used in a circuit board or integrated circuit manufacturing process. The other equipment in-line with the dispensing systems may include, for example, pick and place machines, which place components on circuit boards, or reflow ovens that are used to cure materials dispensed onto the circuit boards or integrated circuits.

In a typical dispensing system, a pump and dispenser assembly is mounted to a moving assembly for moving the pump and dispenser assembly along three mutually orthogonal axes (x, y, z) using servomotors controlled by a computer system or controller. To dispense a dot of liquid on a circuit board at a desired location, the pump and dispenser assembly is moved along the horizontal x and y axes until it is located over the desired location. The pump and dispenser assembly is then lowered along the vertical z axis until the nozzle of the pump and dispenser assembly is at an appropriate dispensing height over the board. The pump and dispenser assembly dispenses a dot of liquid, is then raised along the z axis, moved along the x and y axes to a new location, and is lowered along the z axis to dispense the next liquid dot.

During the manufacture of circuit boards, it is sometimes necessary, or desirable, to dispense two different liquids or pastes onto a circuit board or to dispense different volumes of the same material. Dispensing systems have been designed that can dispense one of a number of dispensing materials from one dispensing head. One example of such a dispensing system is described in U.S. patent application Ser. No. 08/519,146, filed Aug. 24, 1995, U.S. Pat . No. 5,795,390 which is incorporated herein by reference. These dispensing systems typically are only able to dispense one material at a time, and the throughput of product in these systems may be less than desired because of the time required to dispense multiple materials serially using one dispensing head.

To overcome the throughput problem, two dispensing systems may be placed adjacent to each other with the first dispensing system dispensing one material and the second dispensing system dispensing a second material. This solution is expensive since two complete machines are used, and since additional manufacturing space is required. In typical operations, manufacturing floor space is limited, and it is desirable to limit the "footprint" of each manufacturing system on the manufacturing floor.

In electronics assembly, it is not uncommon for some manufacturing systems to utilize multiple conveyor systems operating in parallel to increase product throughput of the systems. Typical prior art dispensing systems do not include multiple conveyor systems and are not fully compatible with other in-line systems using multiple conveyors. Therefore, it would be desirable to provide a dispensing system having multiple conveyors.

It is also desirable to provide a multitasking control system for a multiple conveyor dispensing system that allows subsystems within the dispensing system to operate in a simultaneous, asynchronous manner. In addition, it is desirable for the control system to allow remote monitoring and control of the dispensing system by a remote controller or host computer of the electronics manufacturing facility.

SUMMARY OF THE INVENTION

Embodiments of the present invention overcome drawbacks of the prior art discussed above by providing a multiple head dispensing system having independently controlled dispensing heads. Each of the dispensing heads may be independently controlled to provide simultaneous, asynchronous operation and to allow dispensing of different materials onto substrates.

In embodiments of the present invention, independent control of the dispensing heads is accomplished under the control of a controller in conjunction with a plurality of gantry systems, each of which positions one of the multiple dispensing heads over a substrate that is to receive dispensing material. In some embodiments, each gantry system utilizes two drive mechanisms, arranged in parallel, that provide movement of the dispensing head over an x-y plane.

In some embodiments of the present invention, multiple conveyor systems are utilized that allow parallel processing of work products in the dispensing systems.

Embodiments of the present invention are not limited to dispensing systems, but also include other systems utilizing multiple conveyors and multiple work devices coupled to a plurality of gantry systems to provide independent movement of each of the work devices. In addition, control systems, including control software, in accordance with embodiments of the present invention may be used to control equipment other than dispensing machines, and may be used to control machines having one, or more than one, work devices.

BRIEF DESCRIPTION OF THE DRAWINGS

For a better understanding of the present invention, reference is made to the drawings which are incorporated herein by reference and in which.

DETAILED DESCRIPTION

For purposes of illustration, embodiments of the present invention will now be described with reference primarily to a multiple head dispensing system, however, those skilled in the art will appreciate that embodiments of the present invention are not limited to dispensing systems, but include other systems in which a work device is used to perform some task on a product. Examples of such systems include test and measuring systems, component placement systems, inspection systems and machining systems, such as milling machines. In addition, embodiments of the present invention may include a number of different types of work devices within one system. For example, a system may include a dispensing head, a vision inspection system, and a component placement head, each of which may be positioned independently using its own gantry system.

Figure 1:
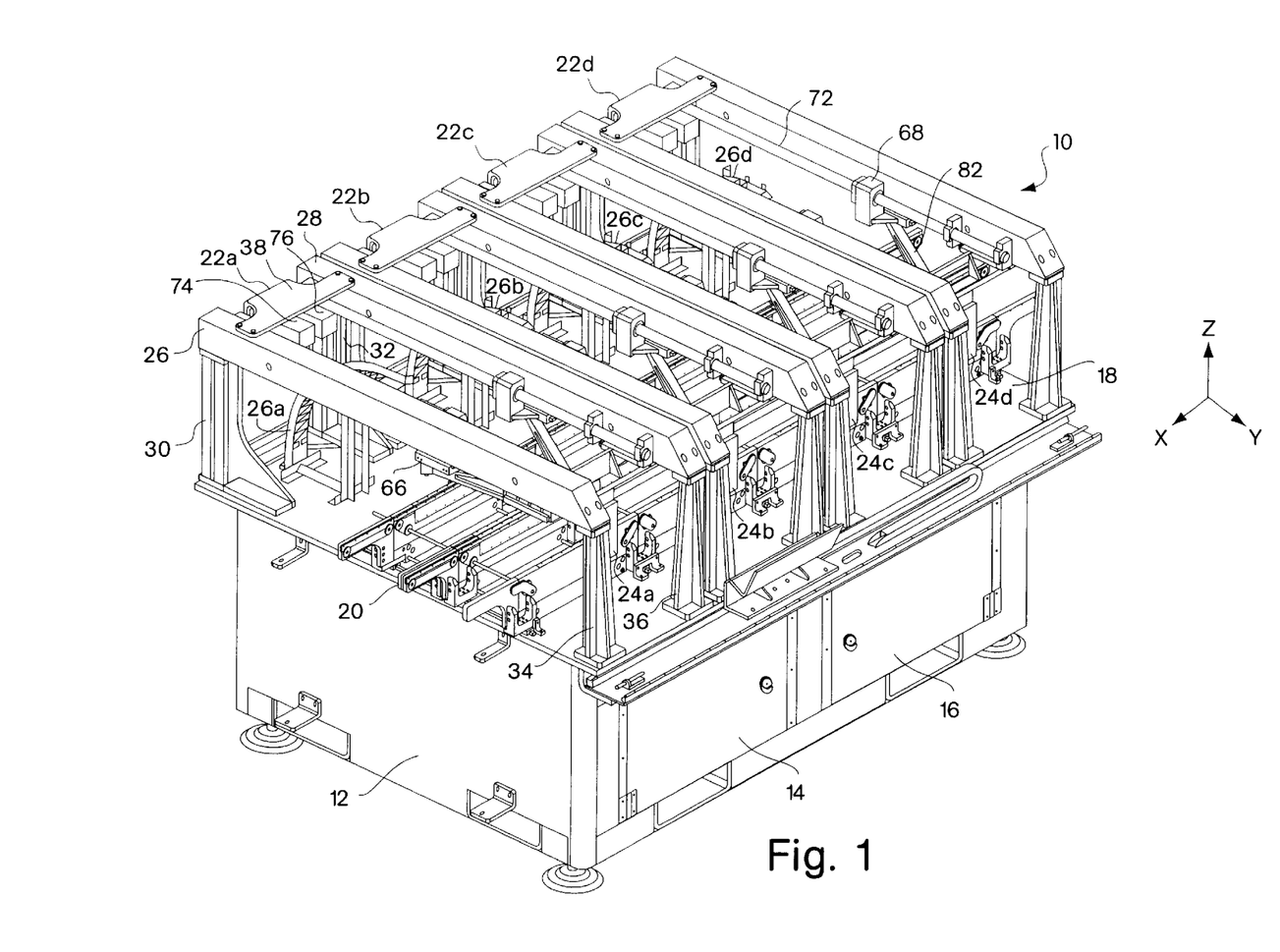
FIG. 1 is a perspective view of a multiple head dispensing system in accordance with one embodiment of the present invention.
Figure 2:
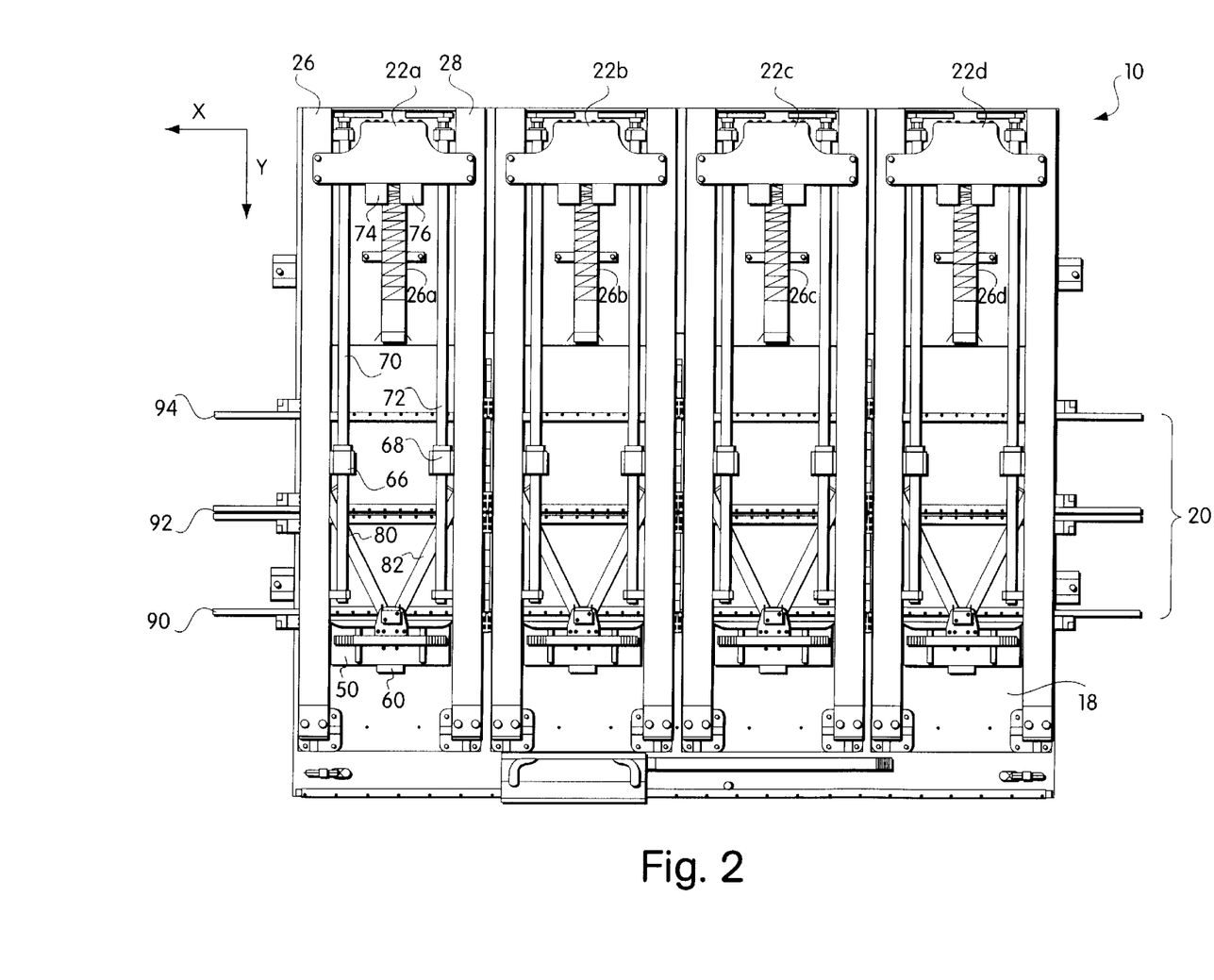
FIG. 2 is a top view of the dispensing system of FIG. 1.

One embodiment of a dispensing system 10 will now be described with reference to FIGS. 1 and 2. FIG. 1 shows a perspective view of a multiple head dispensing system 10 in accordance with one embodiment of the present invention. For ease of illustration, the system is shown in FIG. 1 without an outer covering. FIG. 2 shows a top view of the dispensing system 10.

The dispensing system 10 includes a lower compartment 12 that is used to house electrical and pneumatic controllers and a primary system controller. Access doors 14 and 16 are mounted on the front of the lower compartment to provide access to the equipment contained therein. The top of the lower compartment forms a work surface 18 on which a dual track conveyor 20 resides. Mounted to the work surface 18 are four x/y gantry systems 22a, 22b, 22c and 22d. Each of the gantry systems supports a dispensing head 24a, 24b, 24c and 24d which dispenses material onto substrates loaded into the dispensing system using the conveyor system 20, and in addition, in some embodiments of the present invention, each of the gantry systems supports a camera used as part of a vision system as described below in further detail. The work surface 18 has four holes through which four cable troughs 26a, 26b, 26c and 26d pass. Each of the cable troughs are used to run cables from the control electronics and pneumatics in the lower compartment to each of the dispensing heads 24a, 24b, 24c and 24d. In one embodiment, the cable troughs are implemented using an E-Chain available from Igus Corporation.

The gantry systems 22a, 22b, 22c and 22d are substantially identical and in one embodiment are implemented using one of the gantry systems disclosed in either U.S. patent application Ser. No. 08/967,682, entitled "Positioning System", U.S. Pat. No. 5,886,494 filed concurrently with the present application, or in U.S. patent application Ser. No. 08/796,026, also entitled "Positioning System", filed Feb. 6, 1997, U.S. Pat. No. 5,903,125 both of which are incorporated herein by reference. Gantry system 22a will now be described in greater detail with reference to FIGS. 1 and 2, it being understood that gantry systems 22b, 22c and 22d are substantially identical to gantry system 22a. Gantry system 22a provides positioning of the dispensing head 24a along the horizontal, orthogonal x and y axes shown in FIG. 1. In addition, gantry system 22a includes a motor for lowering the dispensing head in the vertical z direction.

Gantry system 22a includes two horizontal support members 26 and 28 and four vertical support members 30, 32, 34 and 36 coupled to the work surface 18. A motor support plate 38 is coupled between the horizontal support members and is used to support two motors 74 and 76. The gantry 22a also includes a plate 50 that is slidably mounted to rails (not shown) disposed on the under side of each of the horizontal support members so that the plate can move along the y-axis. Dispensing head or pump 24a is mounted to a carriage 60 which in turn is slidably mounted to the plate 50 to permit movement of the dispensing head along the x-axis.

Gantry system 22a further includes two nut blocks 66 and 68 that are slidably movable along the rails mounted under the horizontal support members 26 and 28. Each of the nut blocks is coupled to one of the motors 74, 76 through a respective lead screw 70, 72. The nut blocks can be separately driven by the motors using the lead screws to move the nut blocks along the y-axis. The carriage 60 is connected to each nut block 66, 68 with respective rigid trailing arms 80, 82 that are pivotally connected at one end to one of the nut blocks and at the other end to the carriage 60. As explained in greater detail in U.S. Pat. No. 5,903,125, the dispensing head 24a may be positioned along the x and y axes by moving the nut blocks along the y-axis using motors 74 and 76. Motors 74 and 76, as well as the z-axis motor coupled to the carriage 60, are controlled by the primary system controller located in the lower compartment.

The dispensing heads 24a, 24b, 24c and 24d may be implemented using a number of different dispensing heads or pumps including those disclosed in U.S. patent application Ser. No. 08/562,068, and in U.S. patent application Ser. No. 08/885,005, each of which is incorporated herein by reference.

The gantry systems 22a, 22b, 22c and 22d provide a significant advantage in the dispensing system 10. As described in U.S. Pat. No. 5,903,125, the ratio of the working area beneath the gantry system to the total width of the gantry system is much greater for the gantry systems described above than for typical x/y gantry systems. This reduces the time required to move a work product between work positions in the multiple head dispensing system, and also reduces the total footprint of the dispensing system 10.

Figure 3:
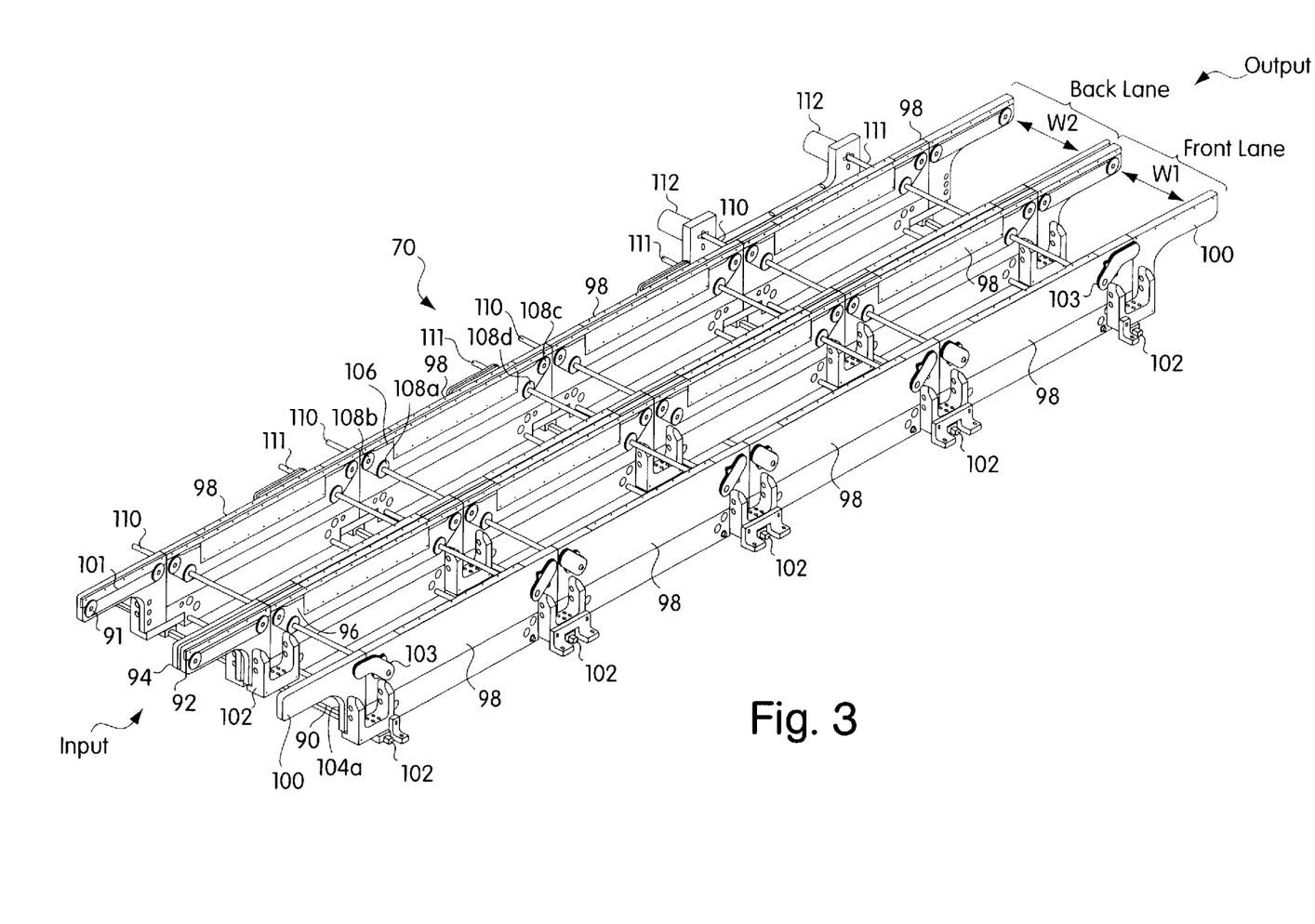
FIG. 3 is a perspective view of a conveyor system used in the dispensing system of FIG. 1.
Figure 4:
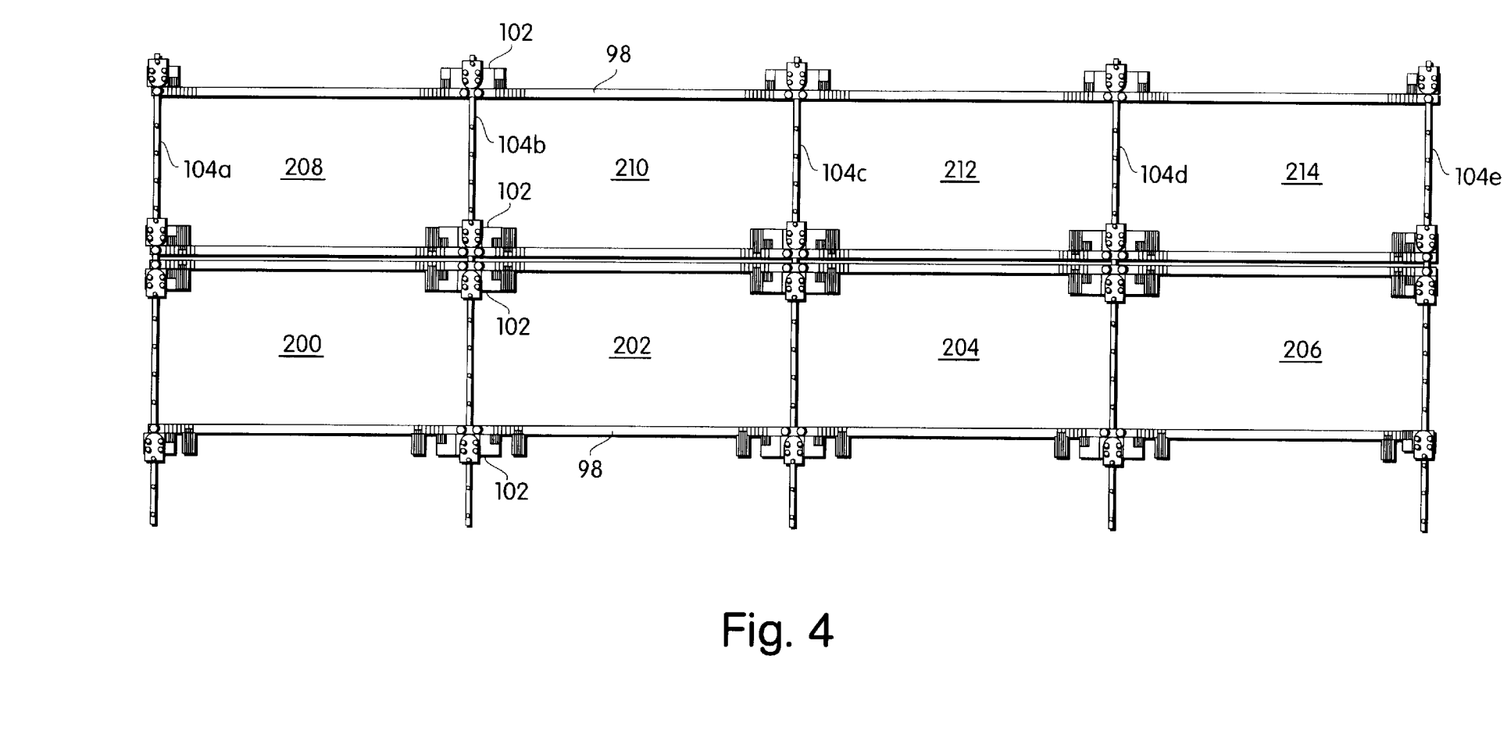
FIG. 4 is a top view of the conveyor system shown in FIG. 3.

The conveyor system 20 will now be described in greater detail with reference to FIGS. 3 and 4. FIG. 3 provides a perspective view of the conveyor system, while FIG. 4 provides a top view. Several elements of the conveyor system have been removed from the top view shown in FIG. 4 for clarity. The conveyor system 70 includes four rails 90, 92, 94 and 96 that define two lanes, identified as a back lane and a front lane, for transporting work products, such as circuit boards, integrated circuit carriers and other substrates into, through, and out of the dispensing system 10. The conveyor sections define eight work areas 200, 202, 204, 206, 208, 210, 212, and 214, as shown in FIG. 4.

Each of the rails comprises four substantially identical, modular conveyor sections 98, and each rail of the conveyor system has an end adapter 100 at each end of the rail. Support blocks 102 are used to hold rail sections 96 together and to hold the conveyor sections in place on the work surface of the dispensing system. The rails are connected by tracks 104a, 104b, 104c, 104d and 104e, which are mounted to the work surface.

The width w1 and w2 of each of the lanes of the conveyor system 20 may be adjusted by moving the rails to different positions along the tracks to accommodate different size work products. Width w1 may be different than width w2.

In one embodiment of the present invention, each of the modular conveyor sections 98 is implemented using a conveyor section in accordance with one of the embodiments disclosed in U.S. patent application Ser. No. 08/745,787, filed Nov. 8, 1996, incorporated herein be reference. Specifically, the conveyor sections include a driver such as a pneumatic cylinder with a camming plate incorporated into the side of the conveyor section. The driver is used to lift work products above the conveyor to a work position beneath one of the dispensing heads of the dispensing system.

Each of the conveyor sections includes a conveyor 106 that may be implemented as a continuous belt consisting of black neoprene over a cotton cord or may be implemented as a series of links. The conveyor 106 is wrapped around four pulleys 108a, 108b, 108c and 108d. A total of eight drive shafts, four drive shafts 110 and four drive shafts 111, are used to operate the conveyors. Each of the drive shafts is coupled to its own motor 112 to allow independent operation of each pair of conveyor sections. Operation of each of the motors is controlled by the primary system controller. For simplification, only two of the motors 112 are shown in FIG. 3.

Four drive shafts 110 are used to drive the conveyor segments in the back lane, and four drive shafts 111 are used to drive the conveyor segments in the front lane. For uniformity and ease of manufacturing, all eight drive shafts are substantially identical, and each of the driveshafts extends through all four rails. Cogs are selectively added to the lower pulleys 108a and 108d to cause the pulleys to rotate with the drive shafts. In the conveyor system 20, for all conveyor sections in the back lane, the lower pulleys closest to the input side of the conveyor system include a cog, and the lower pulleys closest to the output side of the conveyor system do not have a cog. For all conveyor sections in the front lane, the lower pulleys closest to the input side of the conveyor system do not include a cog, and the lower pulleys closest to the output side of the conveyor system do include a cog. This implementation allows each pair of conveyor sections, defining one of the work areas, to operate independently. As understood by those skilled in the art, to meet specific application demands, the cogs may be arranged in other configurations.

Each of the end adapters 100 has a conveyor 101 that is coupled to the conveyor 106 of the adjacent conveyor section using an extension piece 103 so that each conveyor 101 is driven by the conveyor 106 of the adjacent conveyor section.

As described above, all of the conveyor sections 98 are substantially identical. In addition, each conveyor section is symmetrical about a vertical axis perpendicular to the direction of conveyor travel and passing through the middle of the conveyor section. This allows identical conveyor sections to be used on opposite rails of the same lane, and at any position (i.e., at the input end, output end, or in the middle) in any of the rails.

The conveyor system 20 includes several features that make it particularly desirable for use in the multiple head dispensing system 10. First, because the conveyor system is constructed using independently controllable, modular sections, the length of the conveyor system can be readily adjusted. Specifically, the number of segments used in each rail of each lane of the conveyor system may be adapted to correspond to the number of dispensing heads or other workpieces used in the dispensing system.

Second, the width of each rail segment in one embodiment of the present invention is only 0.56 inches thick. This is accomplished by incorporating a thin lifting plate within the side of each conveyor segment, as discussed above. Further, in some embodiments of the present invention, the conveyor belt is not used in clamping the work product in place at the proper work position. Rather, a clamp consisting of an independent blade which is easily removable and can be customized for a given application is used. In addition, an easily removable insert can be added to each segment to reduce the effective width of the conveyor to accommodate a variety of work products. The use of thin rail segments is desirable in embodiments of the present invention to reduce non-productive slew time as a dispensing head is moved from a completed work product in the first lane of the dispensing system to another work product in the second lane of the dispensing system.

Figure 5:
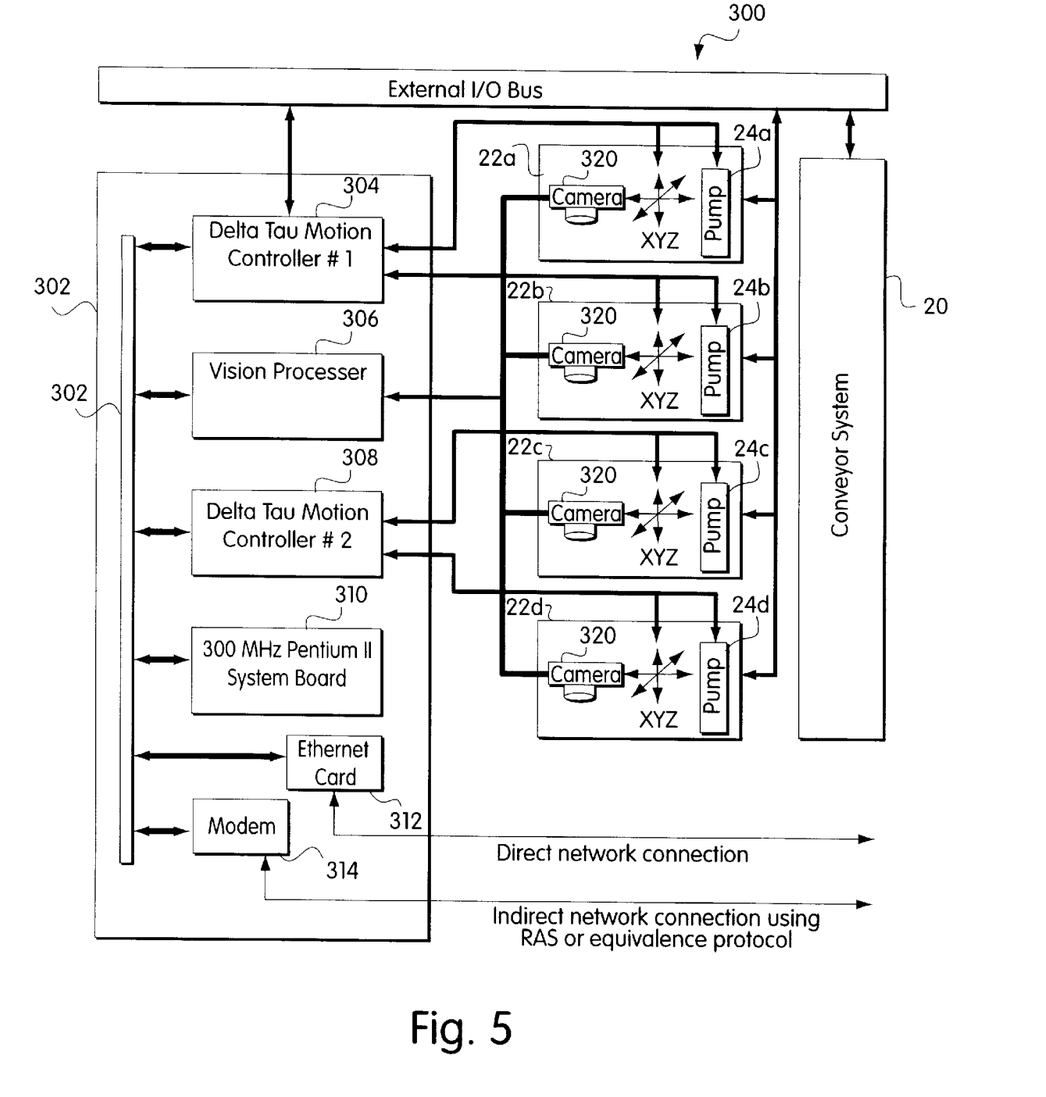
FIG. 5 is a block diagram showing a block diagram of a control system in accordance with one embodiment of the present invention for controlling the dispensing machine of FIG. 1.

The control system of the dispensing system will now be described with reference to FIG. 5, which shows a block diagram of the control system 300. The primary component of the control system is the system controller 302 which is implemented in one embodiment of the present invention using a personal computer with an Intel Pentium® II processor running a version of the Microsoft Windows® NT Operating System, prefereably, version 4.0 or later. The controller is coupled to the conveyor system 20 and each pump 24a, 24b, 24c, and 24d through a communications bus 318, which in one embodiment is physically contained within the motion controller 304 (described below). The controller 302 is also coupled to each of the gantry systems 22a, 22b, 22c and 22d.

The controller 302 includes a system board 310, a vision processor 306, two motion controllers 304 and 308, an ethernet card 312, a modem 314, and an internal bus 302 connecting the components of the controller. The controller may also include a user interface apparatus such as a keyboard, mouse, trackball and monitor coupled to the internal bus 308.

The motion control boards 304 and 308, under the control of the system board, provide signals for controlling: motion of the gantry systems; the dispensing of materials from the pumps; and the movement of the conveyor system 20. In one embodiment of the present invention, each of the motion controller boards are implemented using a Delta Tau PMAC2 Ultralite motion card available from Delta Tau Data Systems, Inc., Northridge, Calif., and each of the cards controls two of the gantry systems.

The vision processor 306 controls and processes signals received from cameras 320 mounted on the gantry systems, and provides processed vision signals to the system board 310. In embodiments of the present invention, the cameras may be used: to locate fiducial marks on work products loaded into the dispensing system for alignment purposes; to inspect work products after material has been dispensed, or some other operation has been performed, and to identify a type of work product loaded into the dispensing system. In one embodiment of the present invention, the vision processor is implemented using a Matrox Meteor Board available from Matrox Electronics Systems Ltd. of Montreal, Canada, and the cameras are implemented using RS-170 compliant cameras available from Sony.

The ethernet card 312 and the modem 314 are not required in all embodiments of the present invention, however, they provide the capability of remote communications for the controller 302.

The overall architecture of the software loaded on the system board 310 and the subsystems that operate within the software will now be described with reference to FIG. 6. The overall software architecture for the control system uses a three-tier client/server model with the three tiers being chassis clients, chassis server, and vision server. The software is designed to be event-driven rather than polled. Accordingly, active objects or subsystems in the control software will suspend themselves until a message is received, and it is the responsibility of the messaging subsystem (described below) to provide basic services for sending, receiving and waiting on messages between subsystems.

Figure 6:
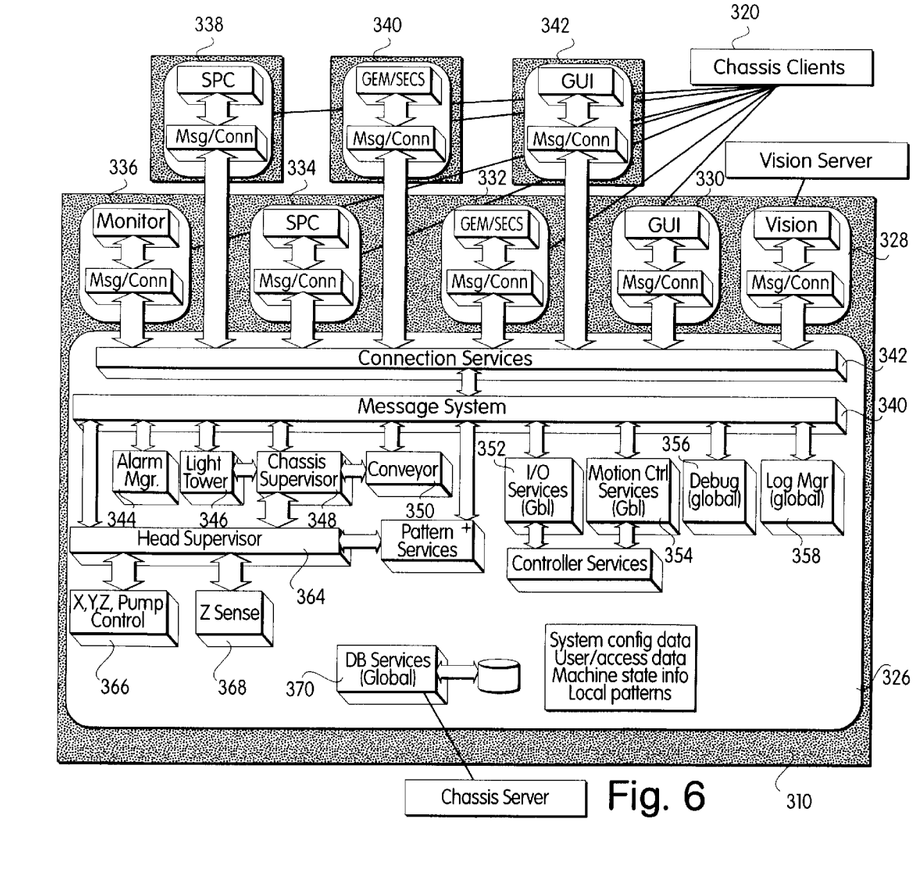
FIG. 6 is a diagram showing the architecture of the software used in the controller of the dispensing system of FIG. 1.

In FIG. 6, block 310 represents the software contained within the system board, and each of the dark boxes 326, 328, 330, 332, 334 and 336 within block 310 represents a Windows NT process operating on the system board, with block 326 representing the chassis server process and blocks 328, 330, 332, 334 and 336 representing chassis client processes. Blocks 348, 340 and 342 represent chassis client processes operating external to the system board, block 328 represents the vision server process, and block 320 represents physical chassis clients which may include one or more local or remote devices from which the operation of the dispensing system can be monitored and controlled. Contained within each of the dark boxes, representing a process, are labeled white boxes which represent subsystems of the processes.

Each of the processes, and the subsystems contained within the processes will now be further described beginning with those subsystems contained within the chassis server process 326. The chassis server process encompasses software that controls the physical equipment (i.e., the gantry systems, the dispensing heads, and the conveyor systems), except for the vision equipment, associated with the dispensing system. The chassis server process is implemented using a single process to facilitate maximum bandwidth for communications between subsystems contained within the chassis server process. In one embodiment of the present invention, the software code used to implement the chassis server process is written in C++.

The message subsystem 340, contained within the chassis server, provides a standardized message system for performing all inter-subsystem communication. The message subsystem is capable of delivering messages to recipients (identified as consumers) in the same process as the consumer and to consumers in different processes using RPC (Remote Procedure Call) calls to deliver messages across boundaries.

The connection services subsystem 342 is responsible for managing local and remote client connections to the chassis server. The connection services subsystem provides a globally accessible connection port for use by chassis clients, manages the creation and deletion of special connections used for transferring large amounts of data, and provides arbitration services for determining which of the chassis clients is designated as a master client. The concept of master client is discussed further below.

The chassis supervisor 348 is responsible for the overall control and coordination of the dispensing system and for guaranteeing the safety of the equipment. It provides control and synchronization over the following subordinate subsystems: head supervisor 364; pattern services 362; conveyor 350; light tower 346; and the vision processor 306.

The pattern services subsystem 362 provides pattern services for the dispensing system. The pattern services subsystem acts essentially as a database containing patterns or recipes that define dispense head positions to create predefined patterns of dispensed materials on substrates. The pattern services subsystem provides pattern read/write services, pattern upload/download services, management of subpatterns of a recipe, and operators for retrieving a next instruction for a specific dispensing head based on a recipe selected for the dispensing head. In embodiments of the present invention, the recipes may include some or all of the following: substrate characteristics (i.e., board dimensions), the sequence of operations to be performed on the substrate, a representation of features of a substrate to be identified by the vision system, and any other information related to the overall process. Additional patterns or recipes may be added to the pattern services subsystem using DLLs (Dynamic Link Libraries).

The conveyor subsystem 350 is responsible for managing the overall state of the conveyor system of the dispensing system. Specifically, the conveyor system performs the following functions: selectively turning conveyor segments and/or lanes on and off as appropriate; managing handshaking with machines upstream and downstream from the dispensing system in an assembly line using SMEMA (Surface Mount Equipment Manufacturers Association) protocols; and notifying the chassis supervisor of events such as the location of circuit boards in the dispensing system via the message subsystem. The conveyor subsystem uses a state machine for managing each conveyor segment and for coordinating the movement of each conveyor segment with its neighbors to bring new substrates in and move existing substrates out at the earliest point in time.

The head supervisor subsystem 364 has the responsibility for controlling position of the dispensing heads to perform a desired dispensing operation based on commands received from the chassis supervisor having pattern or recipe data provided by the pattern services subsystem. A separate instance of a head supervisor object is created for each dispensing head controlled by the control system. Each instance of the head supervisor object includes a message receiver, a state machine, an execution thread to sequence a dispensing head through a pattern or recipe, an X, Y, Z, pump control object (described further below) for communicating with the motion controller cards to provide head motion and pump control, and a Z sense object (which is described further below).

The X, Y, Z, pump control object 366 is responsible for performing dispense operations. These operations do not require real-time response from the chassis services process, but rather, are carried out by the motion controllers in response to a packet of information describing the operation provided by the X, Y, Z, pump control object.

The Z sense object 368 is responsible for determining the height of each of the dispensing heads above the substrates and operates in conjunction with a mechanical touch probe or some other device such as a laser sensor. The height information generated by the Z sense object is used to accurately position a dispensing needle of the dispensing heads at a proper dispensing height over the substrate.

The I/O services subsystem 352 provides a logical interface for all I/O points supported by the dispensing machine. This subsystem is designed to be both configurable and extensible by using information stored in the database services subsystem 370 to define controller information including: identification of controllers contained in the control system; device specific initialization data for the controllers; and available I/O points on the controllers. The I/O services subsystem also defines I/O point configuration information including: logical name of specific I/O points; board assignments and bit assignments.

The motion control manager subsystem 352 provides a generic logical interface for motion control to allow additional options to be added to the dispensing system which require motion control capabilities.

The alarm manager subsystem 344 and the light tower subsystem 346 provide control for an audible alarm and for a light tower attached to the dispensing system.

The log manager subsystem 358 can be configured to receive messages from any other subsystem. The log manager creates a log of received messages on disk for subsequent retrieval. The log manager also supports query services of stored information using date, subsystem, and other fields for selective retrieval of data The debug subsystem 354 is responsible for providing a standard set of mechanisms which all other subsystems can utilize for reporting and/or logging of debug information.

The database services subsystem 370 is responsible for providing a generic set of services for storage and retrieval of all chassis related persistent data, including system initialization data, except for the actual dispense patterns or recipes which are managed by the pattern services subsystem. In embodiments of the present invention, the information managed by this subsystem includes: user security records; controller information; I/O logical-to-physical mapping information; motion control axis logical-to-physical information; general system configuration information such as pump configurations, conveyor configuration, and log file configuration; substrate tracking data; and current pattern information.

In embodiments of the present invention, there are a number of different chassis clients that can be simultaneously connected to the chassis server. Additionally, there may be multiple instances of a particular type of client simultaneously connected to the chassis server. There is a separate NT process for each of the chassis clients. In the embodiment shown in FIG. 6, there are four different types of NT processes shown, monitor 336, SPC (remote 338 and local 334), GEM/SEC (remote 340 and local 332, and GUI (remote 342 and local 332) for connecting to different types of chassis clients. In other embodiments, there may be more or less chassis clients, and other types of chassis clients, such as an application developed by a user of the dispensing system.

The GUI process allows remote and local users to monitor and/or control the dispensing machine using standard graphical user interface devices. In one embodiment of the present invention, the controller of the dispensing machine includes a monitor, keyboard and a trackball or mouse to provide a physical user interface that communicates with the dispensing machine through the local GUI process 330. In other embodiments, a remote computer may provide the physical user interface and connect to the controller of the dispensing system through a RAS (Remote Access Service) connection.

The GEM/SECS (General Equipment Model/Semiconductor Communication Standards) process provides an interface for a factory cell or host computer. In manufacturing facilities it is often desirable to have a central control and monitoring facility. The GEM/SECS process enables embodiments of the dispensing machine to be monitored and controlled by a host computer.

The SPC process is used in embodiments of the present invention to support statistical process control, and may be implemented either within the dispensing system controller or in a remote processor. The SPC process is contained in a process separate from the chassis server to isolate it from the chassis server process to enable it to be operated as a remote process when desired.

The monitor process provides the ability for a remote or local process to monitor the overall activity of the chassis server process. In embodiments of the present invention, the monitor process may be used to track all connections, processes, threads and critical objects, and may be used to assist in performing diagnostics, including remote diagnostics.

As described above, a number of clients may access the chassis server to monitor operation of the dispensing system. However, in a preferred embodiment of the present invention, only one client, referred to as a master, can control the dispensing system at a time. In this embodiment, upon initialization of a system using initialization data contained in the database system, the GUI software operating on the controller in the dispensing equipment is designated as the master client. The GUI software on the controller may pass the master designation to remote clients, and after passing the master to a remote client, may subsequently retrieve it again.

The vision process 328 is an NT process distinct from the client processes and the chassis server process. The vision process provides the software for communicating with the vision processor 306 and the vision hardware in the dispensing machine. The primary client of the vision process is the chassis server process, and more specifically, instances of the head supervisor that make requests to the vision process to, for example, locate an object (such as a fiducial mark) prior to or during execution of a recipe.

In embodiments of the present invention, there are several advantages to implementing the vision process as a distinct process from the chassis server process. First, there is a tight coupling between the GUI and the vision system, to provide a user with images generated by the vision system. Therefore, it is desirable that the vision process and the GUI process be run in the same computer, and in embodiments of the present invention utilizing a remote GUI (i.e., a remote computer), since the vision process is a distinct process, it may be run in the same computer as the GUI.

Second, there is a loose connection between the vision system and the chassis server since minimal amounts of data are transferred between these processes during normal operation of the dispensing system.

Third, performance gains may be realized in embodiments of the present invention due to multiprocessing provided by the vision process in parallel with the processing occurring in the head supervisors. This may be particularly true for embodiments of the present invention incorporating several gantry systems operating simultaneously, so that several instances of head supervisors are also operating simultaneously.

An additional advantage to implementing the vision process as a distinct process is that data libraries, available from different vendors, may be included without introducing possible errors into the core chassis server process. In one embodiment of the present invention, the vision process is implemented using software from Matrox.

The implementation of the control system described above provides several advantages. First, the three tier design approach provides separation of machine control, real-time functions from less performance-critical software, such as the client processes, and allows execution of client processes on remote computers. Second, it provides a standard interface that can be utilized by different types of clients. Third, the software is designed to perform many activities in parallel, asynchronously. For example, implementing the head supervisor of each dispensing head using separate instances, allows the dispensing heads to operate in parallel in an asynchronous manner providing greater flexibility in the operation of the dispensing system.

The operation of the dispensing system 10 will now be described. While specific modes of operation are described herein, one of the significant advantages of embodiments of the present invention is the flexibility of the dispensing system to operate in a variety of modes, and embodiments of the present invention are not limited to the specific modes described herein. In one mode of operation, the dispensing system is configured for dispensing material on one type of circuit board in four separate operations, one operation being performed by each of the four dispensing heads. The front lane and the back lane are both configured to receive the same type of circuit board. In this configuration, when circuit boards are being indexed in one lane, dispensing can occur on the circuit boards in the other lane. This configuration increases the overall throughput of circuit boards compared to typical prior art dispensing systems, and reduces the amount of idle time of the dispensing heads due to indexing of circuit boards. This mode of operation employs a pipelined, parallel architecture to increase total system throughput.

In another mode of operation of the dispensing system 10, the system may be used to increase throughput even though a circuit board (or some other substrate) is to receive only one type of dispensing material, and the dispensing task requires only one size dispensing needle. For this mode of operation, each of the dispensing heads are substantially identical, and the overall dispensing task is divided and organized among the dispensing heads to provide the most efficient mode of operation. The division of the dispensing task among the dispensing heads may be accomplished in one of number of ways. The division may be made based on types of dots to be dispensed, based on dispensing locations on the circuit boards, or on other criteria In the embodiments discussed above, the number of conveyor sections in each rail is equal to the number of dispensing heads in the dispensing system. In other embodiments, the number of conveyor sections may be greater than the number of dispensing heads, and a gap may be provided between two of the gantry systems to provide a conveyor buffer segment Such a buffer segment may be used as a preheat segment or for any other application that may require or benefit from a buffer segment.

In one embodiment of the present invention, the number of conveyor sections may be some multiple of the number of gantry systems. This provides additional flexibility in the operation of the system, and is useful when a work product, such as a circuit board, is larger than the work area of one of the gantry systems.

Embodiments of the present invention utilizing a dual lane conveyor system overcome drawbacks of prior art single lane dispensing systems by providing a system that is compatible with other dual lane manufacturing equipment in an automated assembly line. In addition, the multiple lane embodiments described herein may also be implemented into assembly lines with single lane equipment using a board shuttling mechanism between the multiple lane dispenser and other equipment. This is useful for relatively slow dispensing operations. Further, embodiments of the present invention provide for the dispensing of multiple materials within one dispensing system while maintaining high throughput rates.

Embodiments of the dispensing system described above include four gantry systems and a two lane conveyor system. As readily understood by one skilled in the art, dispensing systems (and other multiple workpiece machines) in accordance with embodiments of the present invention may include more or less than four gantry systems and a conveyor system having more or less than two lanes.

In one embodiment of the present invention, the vision system described above is used to determine a type of circuit board or some other substrate that has been received by the dispensing system. In this embodiment, the control system, based on output signals from the vision system indicative of the type of circuit board, selects a pattern or recipe defining an operation to be performed on the board, and controls the dispensing system to perform the operation. In other embodiments, systems other than the vision system may be used to determine the type of circuit board received. For example, optical decoders, or other devices such as bar code readers, may be used.

Embodiments of the present invention directed to the control system and control software used to monitor and control the dispensing system are not limited for use with dispensing systems or multiple gantry machines. Rather, embodiments of the control system may be used with other machines and devices.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A control system for controlling an apparatus that performs at least one operation on at least one substrate, the control system comprising:

a user interface for coupling to a user interface device through which a user of the apparatus can monitor and control operation of the apparatus;

a chassis server including:

a connection system that provides an interface between the chassis server and the user interface;

a message system, that transfers messages between systems within the chassis server;

a chassis management system that controls the apparatus to perform the at least one operation on the at least one workpiece;

a pattern management system that contains at least one recipe defining characteristics of the operation to be performed on the workpiece, and provides messages over the message system to the chassis management system so that the chassis management system controls the apparatus based on the characteristics of the at least one recipe.

2. The control system of claim 1, wherein the connection system includes a plurality of user interfaces for allowing a plurality of user interface devices to simultaneously monitor operation of the apparatus.

3. The control system of claim 2, wherein the connection system is designed to allow only one user interface device of the plurality of user interface devices to control operation of the apparatus.

4. The control system of claim 3, wherein at least one of the user interfaces is configurable to provide connection to a remote user interface device.

5. The control system of claim 1, wherein the apparatus includes a work head that performs the operation on the substrate, and wherein the control system further includes a head manager that provides an interface between the chassis management system and the work head to communicate commands from the chassis manager to the work head and to transmit status information from the work head to the chassis manager.

6. The control system of claim 5, wherein the apparatus includes a plurality of work heads that can simultaneously perform operations on a plurality of substrates, and wherein the control system is configured to establish a separate instance of the head manager for each of the work heads, so that each of the work heads can simultaneously operate in an asynchronous manner.

7. The control system of claim 6, wherein the pattern management system includes a plurality of recipes, one of which is selected for each instance of the head manager, and wherein characteristics of one of the recipes are communicated to each instance of the head manager by the pattern management system, so that each of the work heads can perform different operations as defined by the recipes.

8. The control system of claim 7, wherein the apparatus is a dispensing system, wherein each of the work heads is a pump for dispensing dots of material on a substrate, and wherein the recipes define dispensing patterns of the dots on the substrate.

9. The control system of claim 8, further comprising a sensor that detects a type of substrate that is loaded into the apparatus and selects a recipe from the pattern management system based on the type of substrate that is loaded into the apparatus.

\* \* \* \* \*